(12) United States Patent
Hsiao et al.

(10) Patent No.: US 11,545,582 B2
(45) Date of Patent: Jan. 3, 2023

(54) METHOD FOR FORMING GATE-ALL-AROUND STRUCTURE

(71) Applicant: TAIWAN SEMICONDUCTOR MANUFACTURING COMPANY, LTD., Hsinchu (TW)

(72) Inventors: Meng-Hsuan Hsiao, Hsinchu (TW); Wei-Sheng Yun, Taipei (TW); Winnie Victoria Wei-Ning Chen, Zhubei (TW); Tung Ying Lee, Hsinchu (TW); Ling-Yen Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 107 days.

(21) Appl. No.: 17/086,988

(22) Filed: Nov. 2, 2020

(65) Prior Publication Data
US 2021/0050457 A1 Feb. 18, 2021

Related U.S. Application Data

(62) Division of application No. 16/005,631, filed on Jun. 11, 2018, now Pat. No. 10,825,933.

(51) Int. Cl.
| *H01L 29/786* | (2006.01) |
| *H01L 29/423* | (2006.01) |
| *H01L 29/16* | (2006.01) |
| *H01L 29/66* | (2006.01) |
| *H01L 27/092* | (2006.01) |
| *H01L 29/06* | (2006.01) |

(52) U.S. Cl.
CPC ...... *H01L 29/78696* (2013.01); *H01L 27/092* (2013.01); *H01L 29/0673* (2013.01); *H01L 29/16* (2013.01); *H01L 29/42392* (2013.01); *H01L 29/66545* (2013.01); *H01L 29/66742* (2013.01)

(58) Field of Classification Search
CPC ............... H01L 29/78696; H01L 29/16; H01L 29/0673; H01L 29/42392; H01L 29/66742; H01L 27/092; H01L 29/66545
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

*Primary Examiner* — Victor A Mandala
(74) *Attorney, Agent, or Firm* — Birch, Stewart, Kolasch & Birch, LLP

(57) ABSTRACT

A method for forming a gate-all-around structure is provided. The method includes forming a plurality of a first type of semiconductor layers and a plurality of a second type of semiconductor layers alternately stacked over a fin. The first type of semiconductor layers includes a first semiconductor layer and a second semiconductor layer, and the first semiconductor layer has a thickness greater than that of the second semiconductor layer. The method also includes removing the second type of semiconductor layers. In addition, the method includes forming a gate to wrap around the first type of semiconductor layers.

20 Claims, 14 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 * | 3/2017 | Ching | H01L 29/66742 |
| 10,170,378 B2 * | 1/2019 | Doornbos | H01L 21/845 |
| 10,236,217 B1 * | 3/2019 | Ando | H01L 29/78654 |
| 10,332,970 B2 * | 6/2019 | Vellianitis | B82Y 10/00 |
| 10,475,935 B2 | 11/2019 | Zhu | |
| 10,535,738 B2 * | 1/2020 | Hsiao | H01L 29/78684 |
| 10,755,985 B2 * | 8/2020 | Mochizuki | H01L 29/401 |
| 10,770,290 B2 * | 9/2020 | Lee | H01L 21/823412 |
| 11,139,400 B2 * | 10/2021 | Kim | H01L 29/78696 |
| 11,201,152 B2 * | 12/2021 | Xie | H01L 29/0649 |
| 2015/0104918 A1 * | 4/2015 | Liu | H01L 21/31144 |
| | | | 438/283 |
| 2015/0372145 A1 * | 12/2015 | Cheng | H01L 29/1033 |
| | | | 257/288 |
| 2016/0240652 A1 * | 8/2016 | Ching | H01L 21/823437 |
| 2017/0104060 A1 * | 4/2017 | Balakrishnan | |
| | | | H01L 21/823412 |
| 2017/0140933 A1 * | 5/2017 | Lee | H01L 29/1079 |
| 2017/0170268 A1 * | 6/2017 | Song | H01L 29/775 |
| 2017/0255735 A1 * | 9/2017 | Kim | G06F 30/392 |
| 2018/0114727 A1 * | 4/2018 | Rodder | H01L 21/823828 |
| 2018/0151452 A1 * | 5/2018 | Doornbos | B82Y 10/00 |
| 2019/0140105 A1 * | 5/2019 | Tsai | H01L 21/823814 |
| 2019/0172751 A1 * | 6/2019 | Smith | H01L 21/823821 |
| 2019/0378934 A1 * | 12/2019 | Hsiao | H01L 29/16 |
| 2020/0027995 A1 * | 1/2020 | Zhu | H01L 29/66742 |
| 2020/0303256 A1 * | 9/2020 | Smith | H01L 29/775 |
| 2021/0184016 A1 * | 6/2021 | Cheng | H01L 21/8221 |

* cited by examiner

US 11,545,582 B2

METHOD FOR FORMING GATE-ALL-AROUND STRUCTURE

CROSS REFERENCE TO RELATED APPLICATIONS

This application is a Divisional application of U.S. patent application Ser. No. 16/005,631, filed on Jun. 11, 2018, the entirety of which is incorporated by reference herein.

BACKGROUND

A transistor, such as a FinFET transistor, comprises a source region, a drain region, and a channel region between the source region and the drain region. The transistor comprises a gate region that controls the channel region to operate the transistor. The gate region can be formed around one or more surfaces of the channel region, which provides the gate region with increased control over the channel region because the transistor can be controlled by a 3D gate area, as opposed to being controlled merely by a 2D gate area associated with a 2D planar transistor.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION OF THE DISCLOSURE

Figure 1:
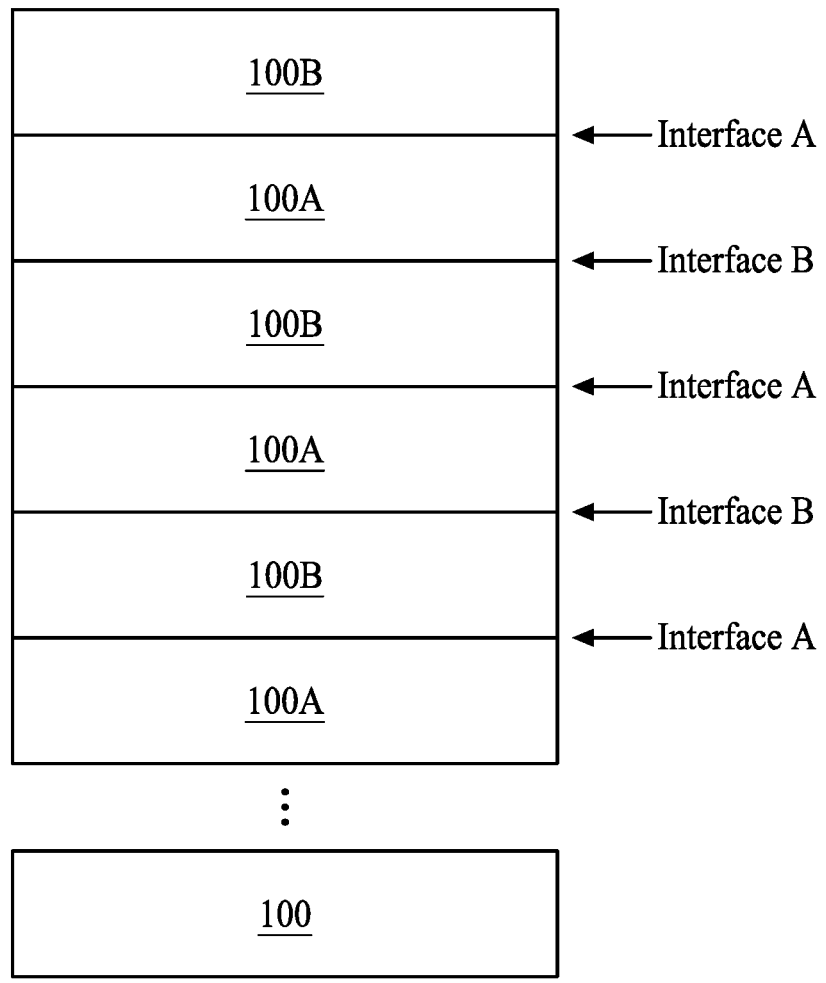
FIG. 1 is a cross sectional view showing interfaces at the epitaxy stack of a semiconductor structure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate-all-around (GAA) structure includes two critical operations highly related to device yield and performance, the epitaxy stack formation and epitaxy stack etching for nanowire releasing. In conventional GAA operation, the epitaxy stack formation includes forming an alternating first nanowire material layer and second nanowire material layer, with the first nanowire material layer having essentially the same thickness as that of the second nanowire material layer. However, it is observed that after nanowire releasing operation, the first nanowires released from the second nanowire material layers are having different thicknesses depending on the level of the first nanowires. For example, the bottom nanowire, which is most proximal to a top surface of the substrate, generally has been observed to have a smaller thickness than the top nanowire, which is most distal to the top surface of the substrate. In other words, each of the nanowires are having different thicknesses after the nanowire releasing should the alternating first nanowire material layer and the second nanowire material layer are initially epitaxially deposited with equal thickness. Thickness variation of the nanowires in a same device generate adverse effects on gate control ability.

Referring to FIG. 1, two types of interfaces, A and B, can be identified in the alternating first nanowire material layer 100A and the second nanowire material layer 100B. The alternating stack is positioned over a substrate 100. The first type of interface A is the interface with the first nanowire material layer 100A at the bottom and the second nanowire material layer 100B at the top, and the second type of interface B vice versa. The first nanowire material layer 100A and the second nanowire material layer 100B have equal thickness as deposited.

Figure 2A:
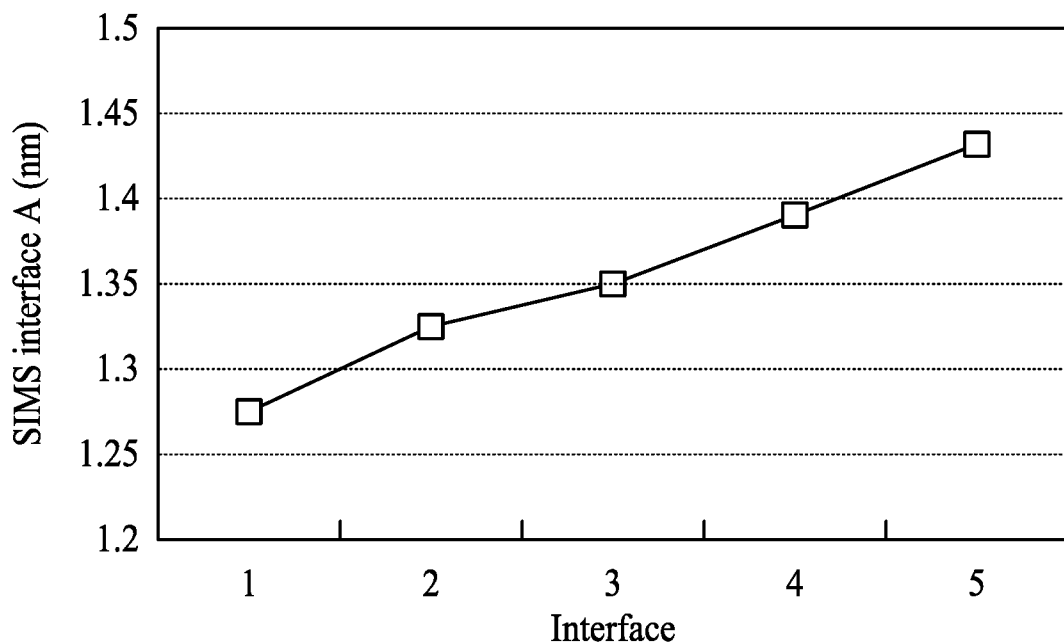
FIG. 2A is a diagram showing thicknesses of interfaces at the epitaxy stack of the semiconductor structure in FIG. 1.

As shown in FIG. 2A, secondary ion mass spectroscopy (SIMS) are conducted at the interface A in order to measure the thickness of the interface A. In some embodiments, the aforesaid thickness of the interface A is defined to be the thickness encompassing 8 to 42 atomic percent of the first nanowire material. The $1^{st}$ interface, as indicated in the X-axis of FIG. 2A, is located most distal to the top surface of the substrate 100 underlying all nanowire material layers and the $5^{th}$ interface is located most proximal to the top surface of the substrate 100. It is observed that the $5^{th}$ interface (about 1.43 nm) is thicker than the $1^{st}$ interface (about 1.27 nm).

Figure 2B:
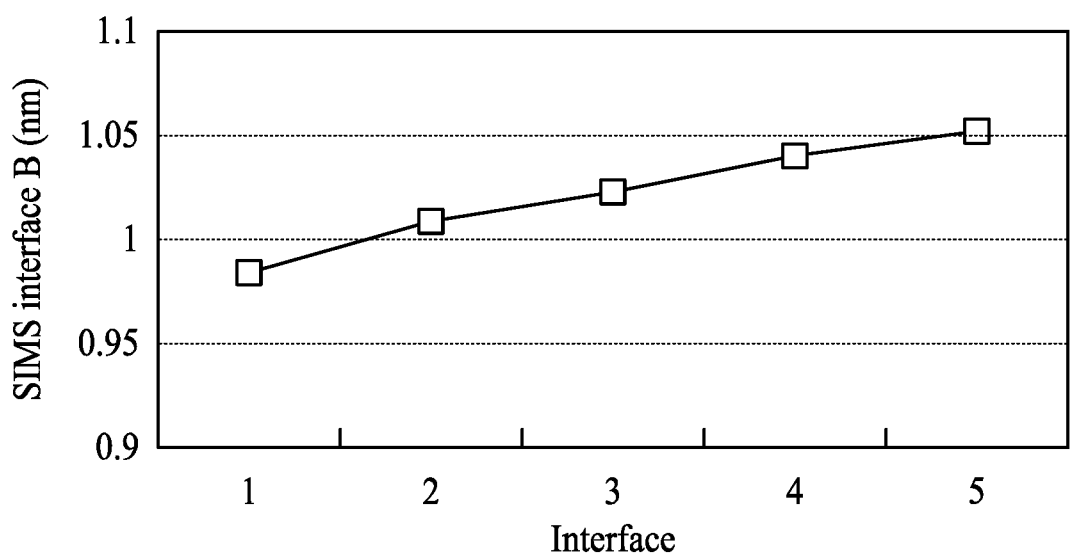
FIG. 2B is a diagram showing thicknesses of interfaces at the epitaxy stack of the semiconductor structure in FIG. 1.

As shown in FIG. 2B, secondary ion mass spectroscopy (SIMS) are conducted at the interface B in order to measure the thickness of the interface B. In some embodiments, the aforesaid thickness of the interface B is defined to be the thickness encompassing 8 to 42 atomic percent of the second nanowire material. The $1^{st}$ interface, as indicated in the X-axis of FIG. 2B, is located most distal to the top surface of the substrate underlying all nanowire material layers and the $5^{th}$ interface is located most proximal to the top surface of the substrate. It is observed that the $5^{th}$ interface (about 1.05 nm) is thicker than the $1^{st}$ interface (about 0.98 nm), although the thickness of the $5^{th}$ interface at interface B (about 1.05 nm) is thinner than the $5^{th}$ interface at interface A (about 1.43 nm).

According to the result shown in FIG. 2A and FIG. 2B, no matter the interface A or B, the more proximal of the interface to the top surface of the substrate, the greater the interface thickness. It is due to the fact that the second nanowire material closer to the top surface of the substrate possesses a greater diffusion length in response to greater thermal budget during the epitaxy stack formation. For example, the bottom pair of the first nanowire material layer and second nanowire material layer endures a prolonged high temperature exposure than that of the top pair of the first nanowire material layer and second nanowire material layer. Consequently, after the epitaxy stack etching for nanowire releasing, the epitaxy stack with thicker interface will render thinner nanowires, and the epitaxy stack with thinner interface will render thicker nanowires. In other words, thicknesses of nanowires after nanowire releasing appears varying thicknesses in a sense that nanowires closer to the top surface of the underlying substrate is thinner, while nanowires further from the top surface of the underlying substrate is thicker.

A new structure is thus required to resolve the nanowire thickness variation problem. The structure provided in the present disclosure introduces a new epitaxy stack, having 1) a first layer of the first nanowire material over the top surface of the semiconductor substrate, the first layer of the first nanowire material having a first thickness; 2) a first layer of the second nanowire material over the first layer of the first nanowire material, the first layer of the second nanowire material having a second thickness; 3) an $N^{th}$ layer of the first nanowire material over the first layer of the second nanowire material, the $N^{th}$ layer of the first nanowire material having a third thickness; 4) an $N^{th}$ layer of the second nanowire material over $N^{th}$ layer of the first nanowire material, the $N^{th}$ layer of the second nanowire material having a fourth thickness; 5) an $(N+1)^{th}$ layer of the first nanowire material over the $N^{th}$ layer of the second nanowire material, the $(N+1)^{th}$ layer of the first nanowire material having a fifth thickness; 6) an $(N+1)^{th}$ layer of the second nanowire material over the $(N+1)^{th}$ layer of the first nanowire material, the $(N+1)^{th}$ layer of the second nanowire material having a sixth thickness. The first thickness is greater than the third thickness, and the third thickness is greater than the fifth thickness. The second thickness is greater than the fourth thickness, and the fourth thickness is greater than the sixth thickness.

The new structure disclosed herein provides greater scale uniformity on the dimension of Si and/or silicon germanium nanowires in the final product and thus gaining better gate control. Furthermore, due to the spacing between vertically adjacent nanowires after nanowire releasing is greater at the bottom than the that at the top of the epitaxy stack, loading effect resulted from metal gate filling occur at the bottom nanowires can also be alleviated.

In the art of gate-all-around MOSFET, several material systems including Group III and Group V materials are currently known and shall be encompassed within the contemplated scope of present disclosure. For example, on a silicon substrate, Si nanowire for NFET and SiGe nanowire for PFET are normally adopted. On a GaAs substrate, GaAs nanowire for NFET and InGaAs nanowire for PFET are normally adopted. On a Ge/GaAs substrate, Ge nanowire for NFET and GaAs nanowire for PFET are normally adopted. For brevity purpose, present disclosure provides illustration and detailed description in Si nanowire and SiGe nanowire material system only. The same inventive concept can be applied on different semiconductor material systems are addressed.

Figure 3A:
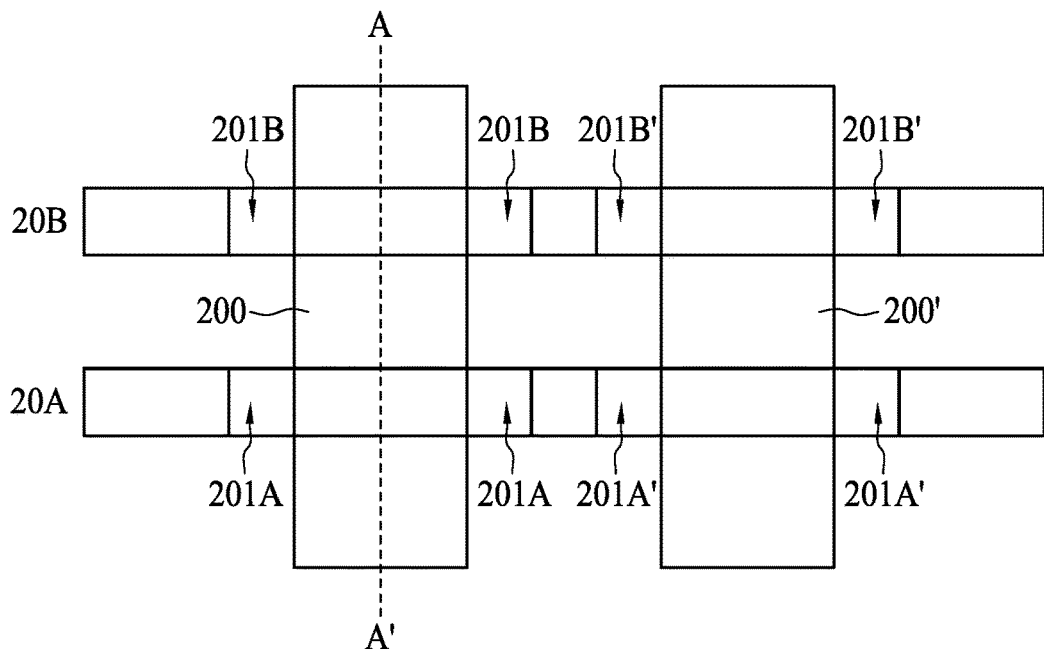
FIG. 3A and FIG. 3B are cross sectional views in an X direction of a PFET and an NFET, respectively, in accordance with some embodiments of the present disclosure.
Figure 3B:
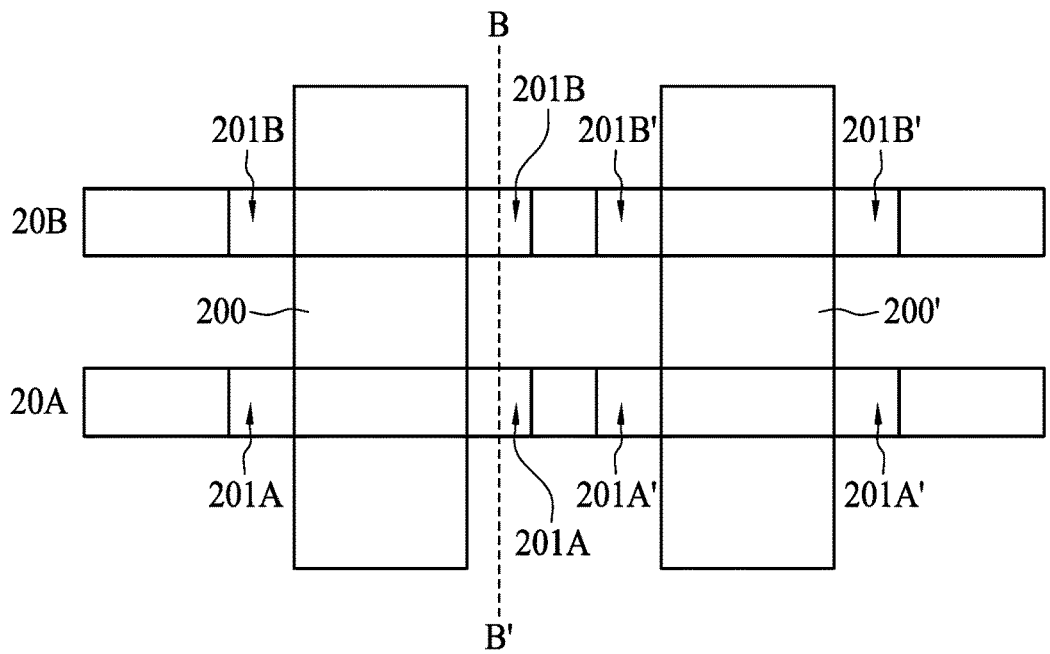

Referring to FIG. 3A and FIG. 3B, FIG. 3A and FIG. 3B are top views showing a non-planar semiconductor structure and dissection lines over different locations, in accordance with some embodiments of the present disclosure. In FIG. 3A, active regions 20A and 20B are illustrated in two parallel strips. In the embodiments describing a Gate-all-around MOSFET structure, the active region includes the doped regions of a patterned semiconductor substrate, as well as the nanowire channel over the patterned semiconductor substrate. In the following disclosure, active region 20A may include a portion of a PMOS transistor structure and active region 20B may include a portion of an NMOS transistor structure. In the present disclosure, numeral label 20A can be commonly referred to the active region having a PMOS transistor structure, and numeral label 20B can be commonly referred to the active region having an NMOS transistor structure. Two gates 200 and 200' are orthogonally disposed over the active regions 20A and 20B, abutted by the source/drain regions 201A, 201B at the gate 200 and source/drain regions 201A', 201B' at the gate 200'. The dissection lines AA' passes through the gate 200 along a longitudinal direction thereof, thereby showing a cross section of the gate 200 and the underlying active regions 20A and 20B in subsequent FIG. 4. Similarly, in FIG. 3B, active regions 20A and 20B are illustrated in two parallel strips. In the following disclosure, active region 20A may be a PMOS transistor structure and active region 20B may be an NMOS transistor structure. Two gates 200 and 200' are orthogonally disposed over the active regions 20A and 20B, abutted by the source/drain regions 201A, 201B at the gate 200 and source/drain regions 201A', 201B' at the gate 200'. The dissection lines BB' passes through the source/drain regions 201A, 201B, thereby showing a cross section of the source/drain region 201A, 201B and the underlying active regions 20A and 20B in subsequent FIG. 5.

Figure 4:
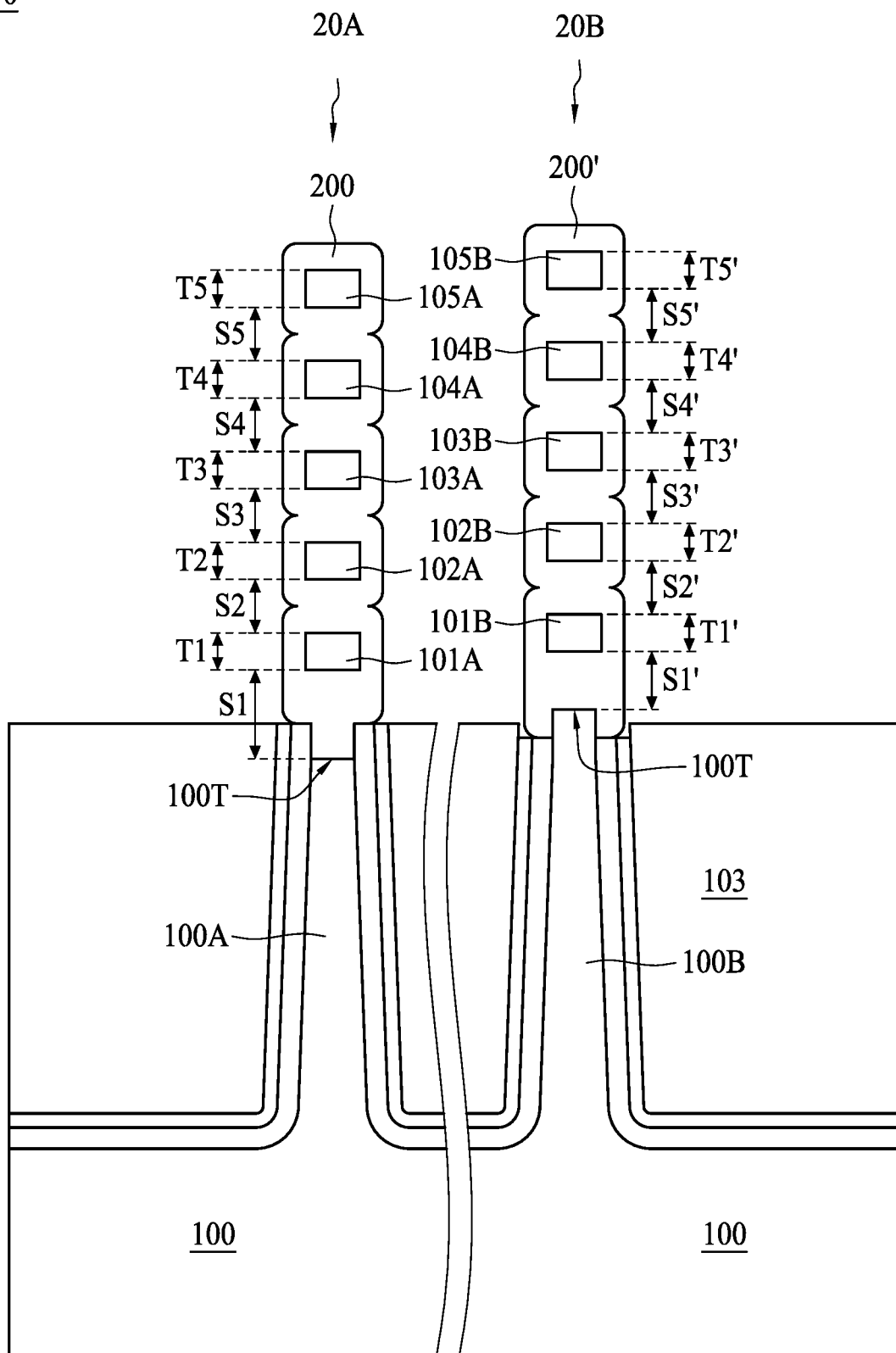
FIG. 4 is a cross sectional view at a channel region of the GAA structure, in accordance with some embodiments of the present disclosure.

Referring to FIG. 4, FIG. 4 is a cross sectional view of a semiconductor structure 40 dissecting along dissection lines AA' of FIG. 3A, in accordance with some embodiments of the present disclosure. The semiconductor structure 40 includes a PMOS 20A and an NMOS 20B. In some embodiments, the PMOS 20A may or may not be disposed adjacent to the NMOS 20B.

The semiconductor structure 40 includes a substrate 100 patterned in to at least two semiconductor fins 100A, 100B. In some embodiments, the substrate 100 includes silicon, and the substrate 100 is formed according to a FinFET arrangement including one or more silicon fins separated by isolation structures 103, such as shallow trench isolation (STI). For example, a first fin 100A and a second fin 100B are formed from on the substrate 100 and having a top surface 100T at each of the fins 100A, 100B. In some embodiments, an anti-punch through region (APT) (not shown in FIG. 4) is formed in proximity to the top surface 100T in the PMOS 20A by an APT implantation with an n-type dopant, such as phosphorous. In some embodiments, an APT (not shown in FIG. 4) is formed in proximity to the top surface 100T in the NMOS 20B by another APT implantation with a p-type dopant, such as boron.

Still referring to FIG. 4, the PMOS 20A further includes a plurality of SiGe nanowires 101A, 102A, 103A, 104A, 105A, along a longitudinal direction of the first fin 100A, connecting the source/drain 201A (shown in FIG. 5) at both ends of the SiGe nanowires 101A, 102A, 103A, 104A, 105A. Among all the SiGe nanowires, 101A is called a first SiGe nanowire, which is the most proximal nanowire to the top surface 100T of the semiconductor fin 100A. Among all the SiGe nanowires, 105A is called a fifth SiGe nanowire, which is the most distal nanowire to the top surface 100T of the semiconductor fin 100A. Although only five SiGe nanowires are illustrated in FIG. 4, the number of nanowires over the top surface 100T of the semiconductor fin 100A is not limited thereto. Any number compatible to the device design and technology is encompassed in scope of current disclosure. In some embodiments, the first SiGe nanowire is not necessary the nanowire most proximal to the top surface 100T. In other words, the first SiGe nanowire can be second- or third-proximal to the top surface 100T, as long as the so-called second SiGe nanowire is more distal to the top surface 100T than the first SiGe nanowire.

In some embodiments, a space between the top surface 100T and the first SiGe nanowire 101A is denoted as S1, a space between the first SiGe nanowire 101A and the second. SiGe nanowire 102A is denoted as S2, a space between the second SiGe nanowire 102A and the third SiGe nanowire 103A is denoted as S3, a space between the third SiGe nanowire 103A and the fourth SiGe nanowire 104A is denoted as S4, a space between the fourth SiGe nanowire 104A and the fifth SiGe nanowire 105A is denoted as S5. In the present disclosure, space S1 is greater than any of the spaces S2, S3, S4, and S5. Space S2 is greater than any of the spaces S3, S4, and S5. Space S3 is greater than any of the spaces S4 and S5. Space S4 is greater than space S5. In some embodiments, space S1 is greater than space S2, which is then greater than space S3, which is then greater than space S4, which is then greater than S5. In some embodiments, the gate 200 is filled between adjacent SiGe nanowires 101A, 102A, 103A, 104A, 105A, as well as between the top surface 100T and the bottom SiGe nanowire 101A.

In the naming convention provided above, space between an $N^{th}$ SiGe nanowire and an $(N+1)^{th}$ SiGe nanowire is denoted as S(N+1). In some embodiments, when N equal to or greater than 6, S(N+1) is at least greater than S1 by 1 nm, in some embodiments, when N equal to or greater than 6, S(N+1) is at least greater than S1 by a range from about 0.5 nm to about 1.5 nm.

In some embodiments, a thickness of the first SiGe nanowire 101A is denoted as T1, a thickness of the second SiGe nanowire 102A is denoted as T2, a thickness of the third SiGe nanowire 103A is denoted as T3, a thickness of the fourth SiGe nanowire 104A is denoted as T4, a thickness of the fifth SiGe nanowire 105A is denoted as T5. In the present disclosure, thickness T1 is substantially identical to any of the thicknesses T2, T3, T4, and T5. In some embodiments, the thicknesses of the SiGe wires 101A to 105A are measured at a defined boundary between SiGe and the metal gate material.

Similarly, the NMOS 20B further includes a plurality of Si nanowires 101B, 102B, 103B, 104B, 105B, along a longitudinal direction of the second fin 100B, connecting the source/drain 201B (shown in FIG. 5) at both ends of the Si nanowires 101B, 102B, 103B, 104B, 105B. Among all the Si nanowires, 101B is called a first Si nanowire, which is the most proximal nanowire to the top surface 100T of the semiconductor fin 100B. Among all the Si nanowires, 105B is called a fifth Si nanowire, which is the most distal nanowire to the top surface 100T of the semiconductor fin 100B. Although only five Si nanowires are illustrated in FIG. 4, the number of nanowires over the top surface 100T of the semiconductor fin 100B is not limited thereto. Any number compatible to the device design and technology is encompassed in scope of current disclosure. In some embodiments, the first Si nanowire is not necessary the nanowire most proximal to the top surface 100T. In other words, the first Si nanowire can be second- or third-proximal to the top surface 100T, as long as the so-called second Si nanowire is more distal to the top surface 100T than the first Si nanowire.

In some embodiments, a space between the top surface 100T and the first Si nanowire 101B is denoted as S1', a space between the first Si nanowire 101B and the second Si nanowire 102B is denoted as S2', a space between the second Si nanowire 102B and the third Si nanowire 103B is denoted as S3', a space between the third Si nanowire 103B and the fourth Si nanowire 104B is denoted as S4', a space between the fourth Si nanowire 104B and the fifth Si nanowire 105B is denoted as S5'. In the present disclosure, space S1' is greater than any of the spaces S2', S3', S4', and S5'. Space S2' is greater than any of the spaces S3', S4', and S5'. Space S3' is greater than any of the spaces S4' and S5'. Space S4' is greater than space S5'. In some embodiments, space S1' is greater than space S2', which is then greater than space S3', which is then greater than space S4', which is then greater than S5'. In some embodiments, the gate 200' is filled between adjacent Si nanowires 101B, 102B, 103B, 104B, 105B, as well as between the top surface 100T and the bottom Si nanowire 101B.

In the naming convention provided above, space between an $N^{th}$ Si nanowire and an $(N+1)^{th}$ Si nanowire is denoted as S(N+1)'. In some embodiments, when N equal to or greater than 6, S(N+1)' is at least greater than S1' by 0.5 nm. In some embodiments, when N equal to or greater than 6, S(N+1)' is at least greater than S1' by a range from about 0.5 nm to about 1.5 nm.

In some embodiments, a thickness of the first Si nanowire 101B is denoted as T1' a thickness of the second Si nanowire 102B is denoted as T2', a thickness of the third Si nanowire 103B is denoted as T3', a thickness of the fourth Si nanowire 104B is denoted as T4', a thickness of the fifth Si nanowire 105B is denoted as T5'. In the present disclosure, thickness T1' is substantially identical to any of the thicknesses T2', T3', T4', and T5'. In some embodiments, the thicknesses of the Si wires 101B to 105B are measured at a defined boundary between Si and the metal gate material.

Figure 5:
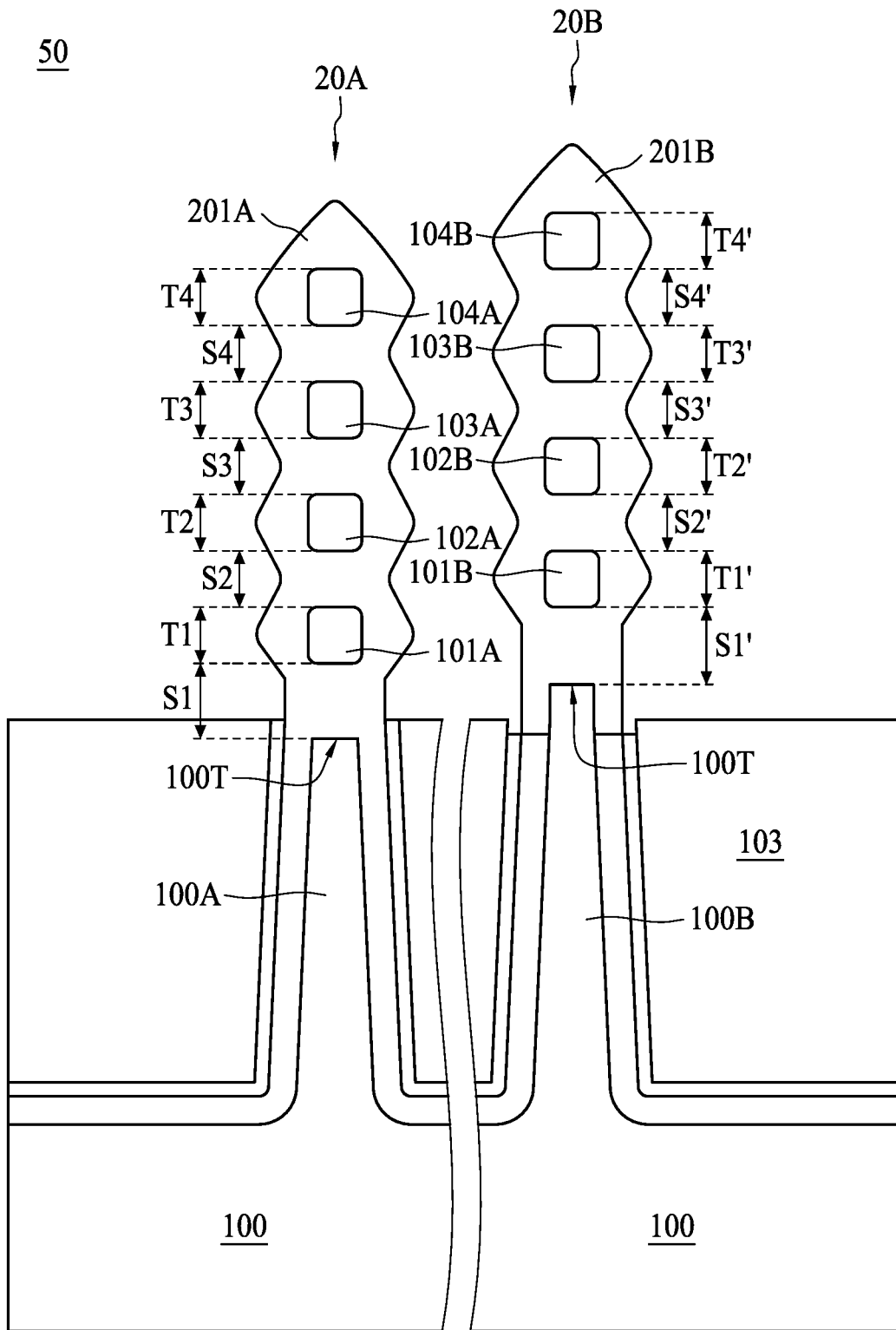
FIG. 5 is a cross sectional view at a source/drain region of the GAA structure, in accordance with some embodiments of the present disclosure.

Referring to FIG. 5, FIG. 5 is a cross sectional view of a semiconductor structure 50 dissecting along dissection lines BB' of FIG. 3B, in accordance with some embodiments of the present disclosure. The semiconductor structure 50 includes a PMOS 20A and an NMOS 20B. In some embodiments, the PMOS 20A may or may not be disposed adjacent to the NMOS 20B. Identical numeral labels in FIG. 5 and FIG. 4 refer to the same components or their equivalents and are not repeated here for brevity. In FIG. 5, source/drain 201A of PMOS 20A is surrounding SiGe nanowires 101A, 102A, 103A, 104A, whereas source/drain 201B of NMOS 20B is surrounding Si nanowires 101B, 102B, 103B, 104B and the barrier layer 110B. As shown in FIG. 5, a contour of the source/drain 201A or 201B shows faceted sidewall according to each nanowire.

The semiconductor structure 50 includes a substrate 100 patterned in to at least two semiconductor fins 100A, 100B. In some embodiments, the substrate 100 includes silicon, and the substrate 100 is formed according to a FinFET arrangement including one or more silicon fins separated by isolation structures 103, such as shallow trench isolation (STI). For example, a first fin 100A and a second fin 100B are formed from on the substrate 100 and having a top surface 100T at each of the fins 100A, 100B. In some embodiments, an anti-punch through region (APT) (not shown in FIG. 5) is formed in proximity to the top surface 100T in the PMOS 20A by an APT implantation with an n-type dopant, such as phosphorous. In some embodiments, an APT (not shown in FIG. 5) is formed in proximity to the top surface 100T in the NMOS 20B by another APT implantation with a p-type dopant, such as boron.

Referring to FIG. 5, the NMOS 20B further includes a plurality of Si nanowires 101B, 102B, 103B, 104B, along a longitudinal direction of the second fin 100B, connecting the source/drain 201B at both ends of the Si nanowires 101B, 102B, 103B, 104B. Among all the Si nanowires, 101B is called a first Si nanowire, which is the most proximal nanowire to the top surface 100T of the semiconductor fin 100B. Among all the Si nanowires, 104B is called a fourth Si nanowire, which is the most distal nanowire to the top surface 100T of the semiconductor fin 100B. Although only four Si nanowires are illustrated in FIG. 5, the number of nanowires over the top surface 100T of the semiconductor fin 100B is not limited thereto. Any number compatible to the device design and technology is encompassed in scope of current disclosure. In some embodiments, the first Si nanowire is not necessary the nanowire most proximal to the top surface 100T. In other words, the first Si nanowire can be second- or third-proximal to the top surface 100T, as long as the so-called second Si nanowire is more distal to the top surface 100T than the first Si nanowire.

In some embodiments, a space between the top surface 100T and the first Si nanowire 101B is denoted as S1', a space between the first Si nanowire 101B and the second Si nanowire 102B is denoted as S2', a space between the second Si nanowire 102B and the third Si nanowire 103B is denoted as S3', a space between the third Si nanowire 103B and the fourth Si nanowire 104B is denoted as S4'. In the present disclosure, space S1' is greater than any of the spaces S2', S3', and S4'. Space S2' is greater than any of the spaces S3' and S4'. Space S3' is greater than any of the spaces S4'. In some embodiments, space S1' is greater than space S2', which is then greater than space S3', which is then greater than space S4'. In some embodiments, the source/drain 201B is filled between adjacent Si nanowires 101B, 102B, 103B, 104B, as well as between the top surface 100T and the first Si nanowire 101B. In some embodiments.

In the naming convention provided above, space between an $N^{th}$ Si nanowire and an $(N+1)^{th}$ Si nanowire is denoted as S(N+1)'. In some embodiments, when N equal to or greater than 6, S(N+1)' is at least greater than S1' by 1 nm. In some embodiments, when N equal to or greater than 6, S(N+1)' is at least greater than S1' by a range from about 0.5 nm to about 1.5 nm.

In some embodiments, a thickness of the first Si nanowire 101B is denoted as T1', a thickness of the second Si nanowire 102B is denoted as T2', a thickness of the third Si nanowire 103B is denoted as T3', a thickness of the fourth Si nanowire 104B is denoted as T4'. In the present disclosure, thickness T1' is substantially identical to any of the thicknesses T2', T3', and T4'. In some embodiments, the thicknesses of the Si wires 101B to 104B are measured at a defined boundary between Si and the source/drain material 201B.

Similarly, the PMOS 20A further includes a plurality of SiGe nanowires 101A, 102A, 103A, 104A, along a longitudinal direction of the first fin 100A, connecting the source/drain 201A at both ends of the SiGe nanowires 101A, 102A, 103A, 104A. Among all the SiGe nanowires, 101A is called a first SiGe nanowire, which is the most proximal nanowire to the top surface 100T of the semiconductor fin 100B. Among all the SiGe nanowires, 104A is called a fourth SiGe nanowire, which is the most distal nanowire to the top surface 100T of the semiconductor fin 100A. Although only four SiGe nanowires are illustrated in FIG. 5, the number of nanowires over the top surface 100T of the semiconductor fin 100A is not limited thereto. Any number compatible to the device design and technology is encompassed in scope of current disclosure. In some embodiments, the first SiGe nanowire is not necessary the nanowire most proximal to the top surface 100T. In other words, the first SiGe nanowire can be second- or third-proximal to the top surface 100T, as long as the so-called second SiGe nanowire is more distal to the top surface 100T than the first SiGe nanowire.

In the naming convention provided above, space between an $N^{th}$ SiGe nanowire and an $(N+1)^{th}$ SiGe nanowire is denoted as S(N+1). In some embodiments, when N equal to or greater than 6, S(N+1) is at least greater than S1 by 1 nm. In some embodiments, when N equal to or greater than 6, S(N+1) is at least greater than S1 by a range from about 0.5 nm to about 1.5 nm.

In some embodiments, a thickness of the first SiGe nanowire 101A is denoted as T1, a thickness of the second SiGe nanowire 102A is denoted as T2, a thickness of the third SiGe nanowire 103A is denoted as T3, a thickness of the fourth SiGe nanowire 104A is denoted as T4. In the present disclosure, thickness T1 is substantially identical to any of the thicknesses T2, T3, and T4. In some embodiments, the thicknesses of the SiGe wires 101A to 104A are measured at a defined boundary between SiGe and the source/drain material 201A.

Figure 6:
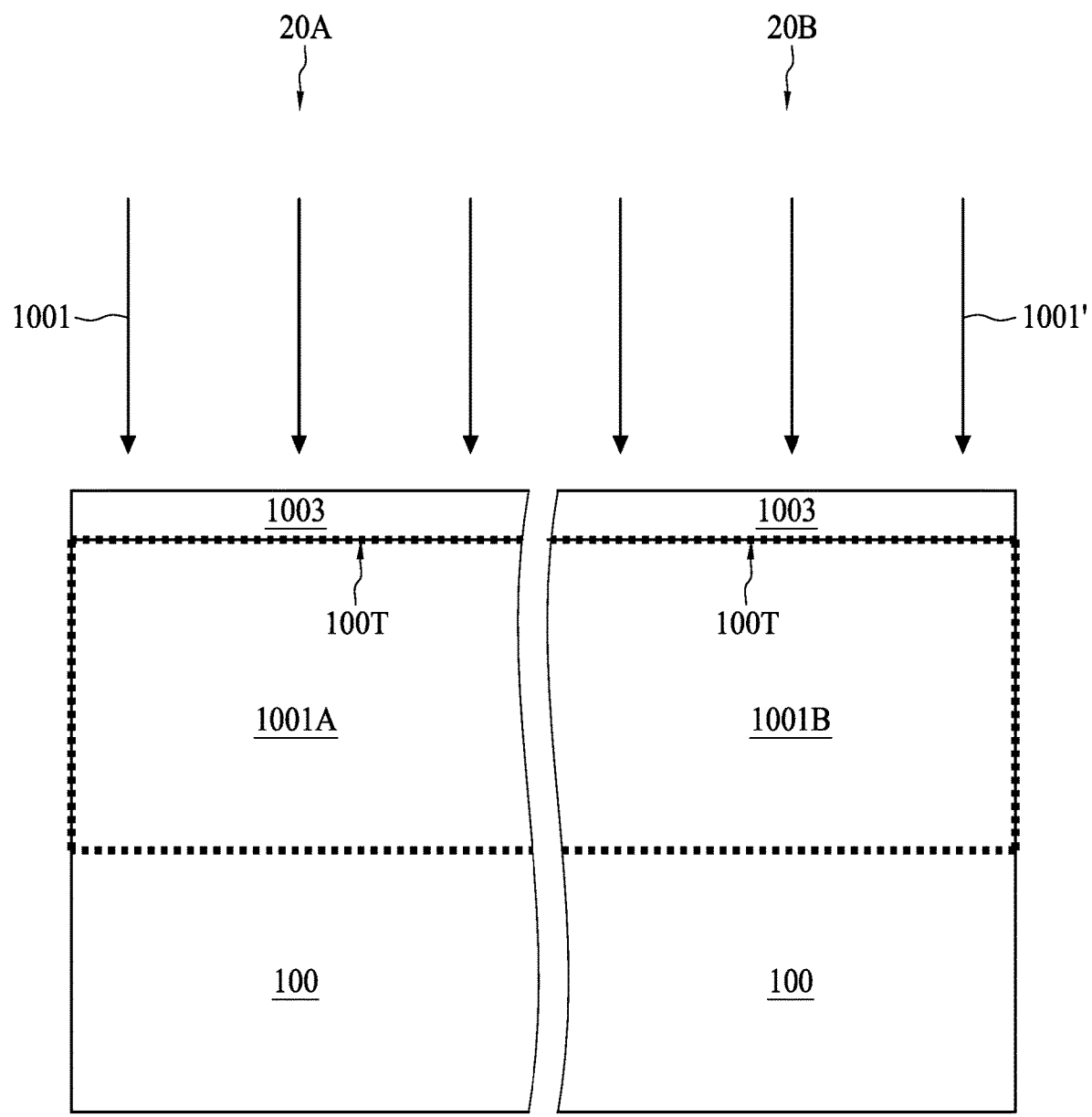
FIG. 6 to FIG. 14 are cross sectional views during an intermediate stage of manufacturing operations, in accordance with some embodiments of the present disclosure.

FIG. 6 to FIG. 14 are cross sectional views showing intermediate operations in manufacturing a semiconductor structure, in accordance with some embodiments of the present disclosure. For comprehensive purpose, left side of the substrate 100 shows the manufacturing operations of a PMOS 20A, and right side of the substrate 100 shows the manufacturing operations of an NMOS 20B. In FIG. 6, a sacrificial layer 1003 is formed over a top surface 100T of a substrate 100. In some embodiments, the sacrificial layer 1003 can be an oxide or a nitride deposited by CVD, PVD, or other suitable methods. In PMOS 20A, a first implantation operation 1001 is performed to form an n-type well 1001A extending downward from the top surface 100T. In some embodiments, the high energy dopants of the first implantation penetrate the sacrificial layer 1003 and enter into the substrate 100. Similarly, in NMOS 20B, a second implantation operation 1001' is performed to form a p-type well 1001B extending downward from the top surface 100T. Masking or photo resist patterning was conducted between the first implantation operation and the second implantation operation to form the n-type well 1001A and the p-type well 1001B, respectively, and is omitted here for simplicity. In addition, forming the p-type well 1001B does not necessarily have to be the operation immediately subsequent to forming the n-type well 1001A. In some embodiments, operations for manufacturing PMOS 20A can be performed before operations for manufacturing NMOS 20B. In some embodiments, operations for manufacturing PMOS 20A can be performed in turns with operations for manufacturing NMOS 20B.

Figure 7:
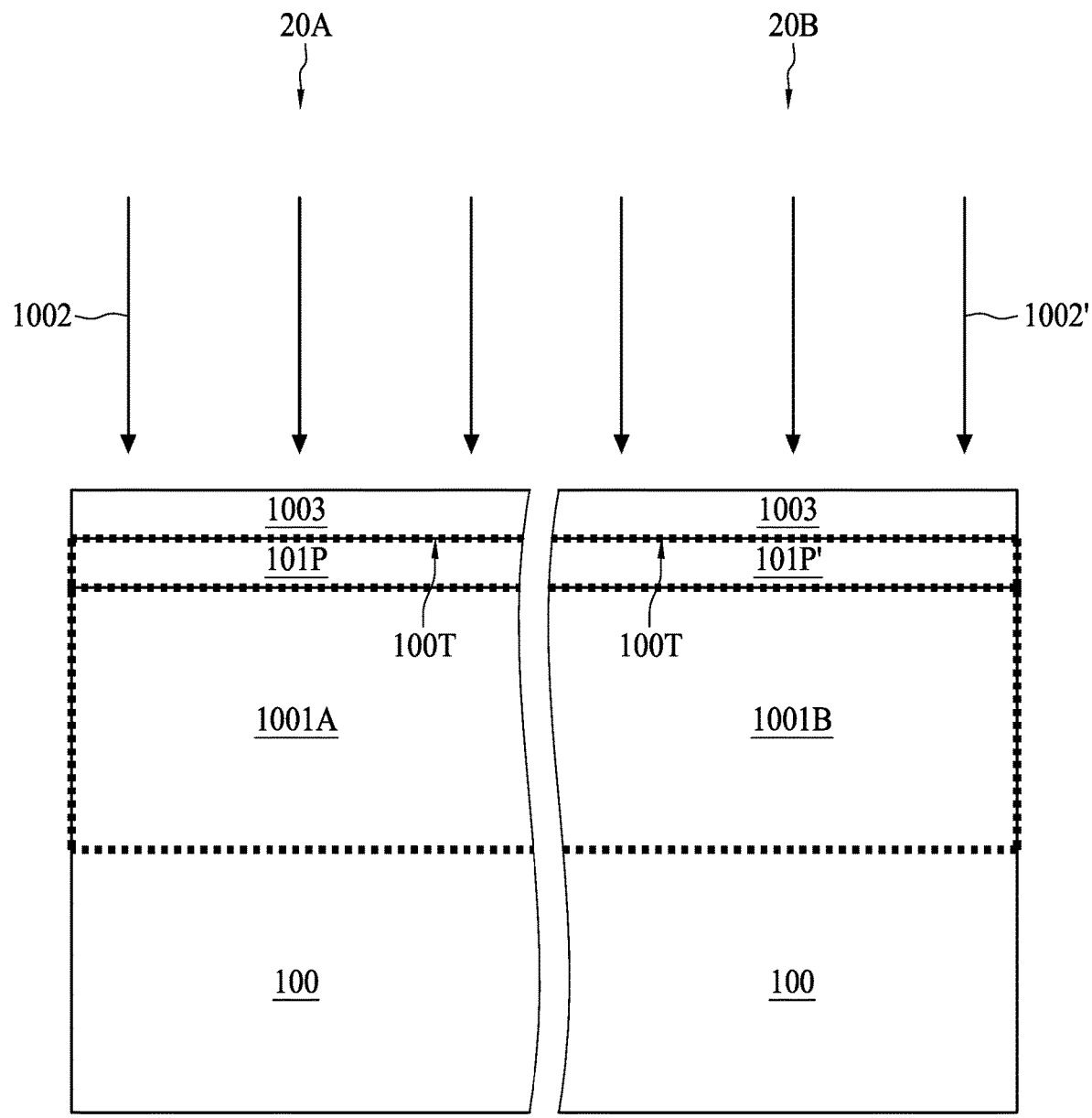
Figure 12:
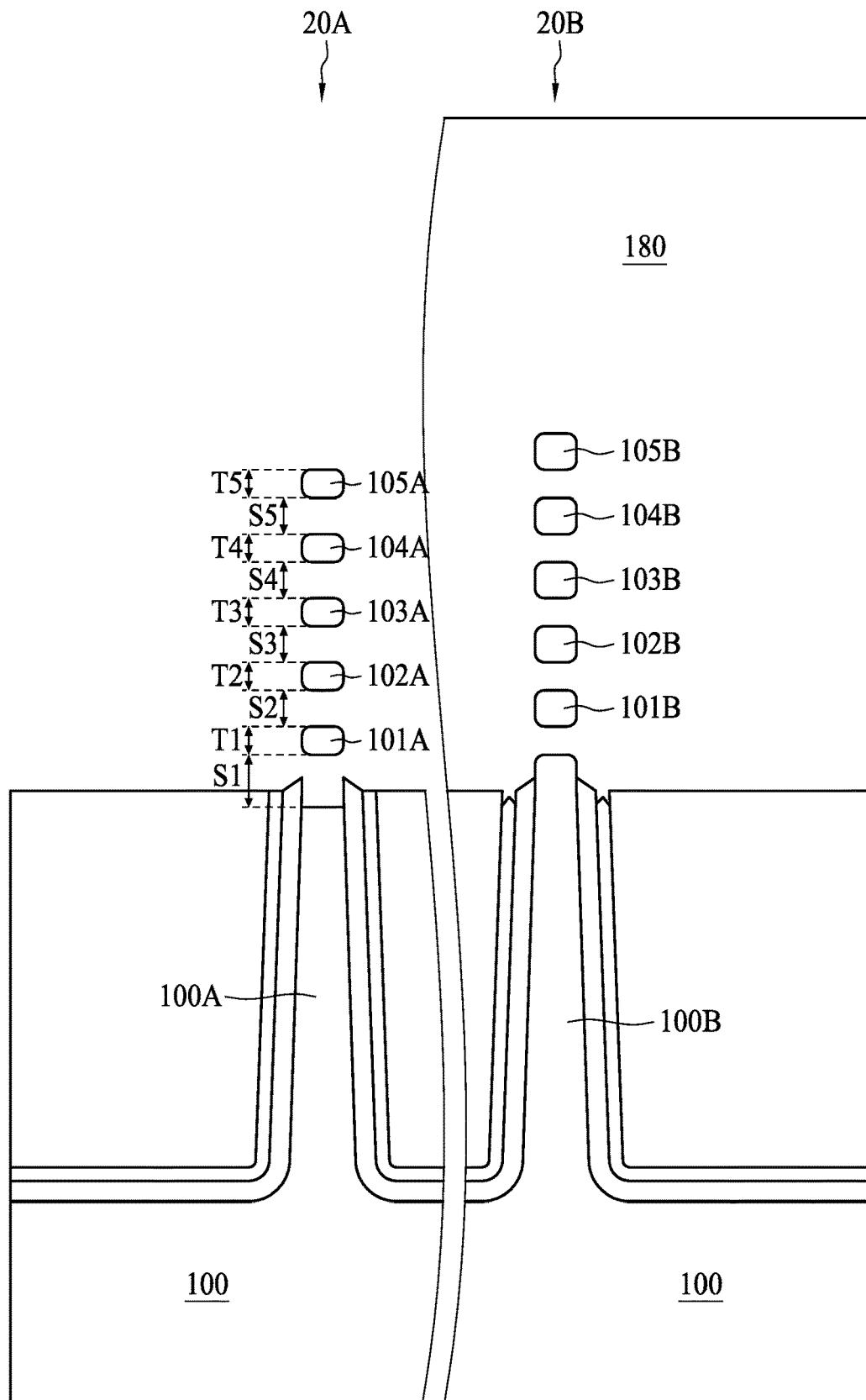

In FIG. 7, a first anti-punch through (APT) implantation operation 1002 is performed to provide n-type dopants, for instance, phosphorous or arsenic, into a first APT region 101P in the PMOS 20A. The first APT region 101P is shallower than the n-type well 1001A and is in proximity to the top surface 100T. A second anti-punch through (APT) implantation operation 1002' is performed to provide p-type dopants, for instance, boron, into a second APT region 101P' in the NMOS 20B. The second APT region 101P' is shallower than the p-type well 1001B and is in proximity to the top surface 100T. The first APT region 101P and the second APT region 101P' are both underlying and abutting the sacrificial layer 1003. In FIG. 12, the sacrificial layer 1003 is removed from the top surface 100T of semiconductor substrate 100 in the PMOS 20A and NMOS 20B, by oxide or nitride stripping operations.

Figure 8:
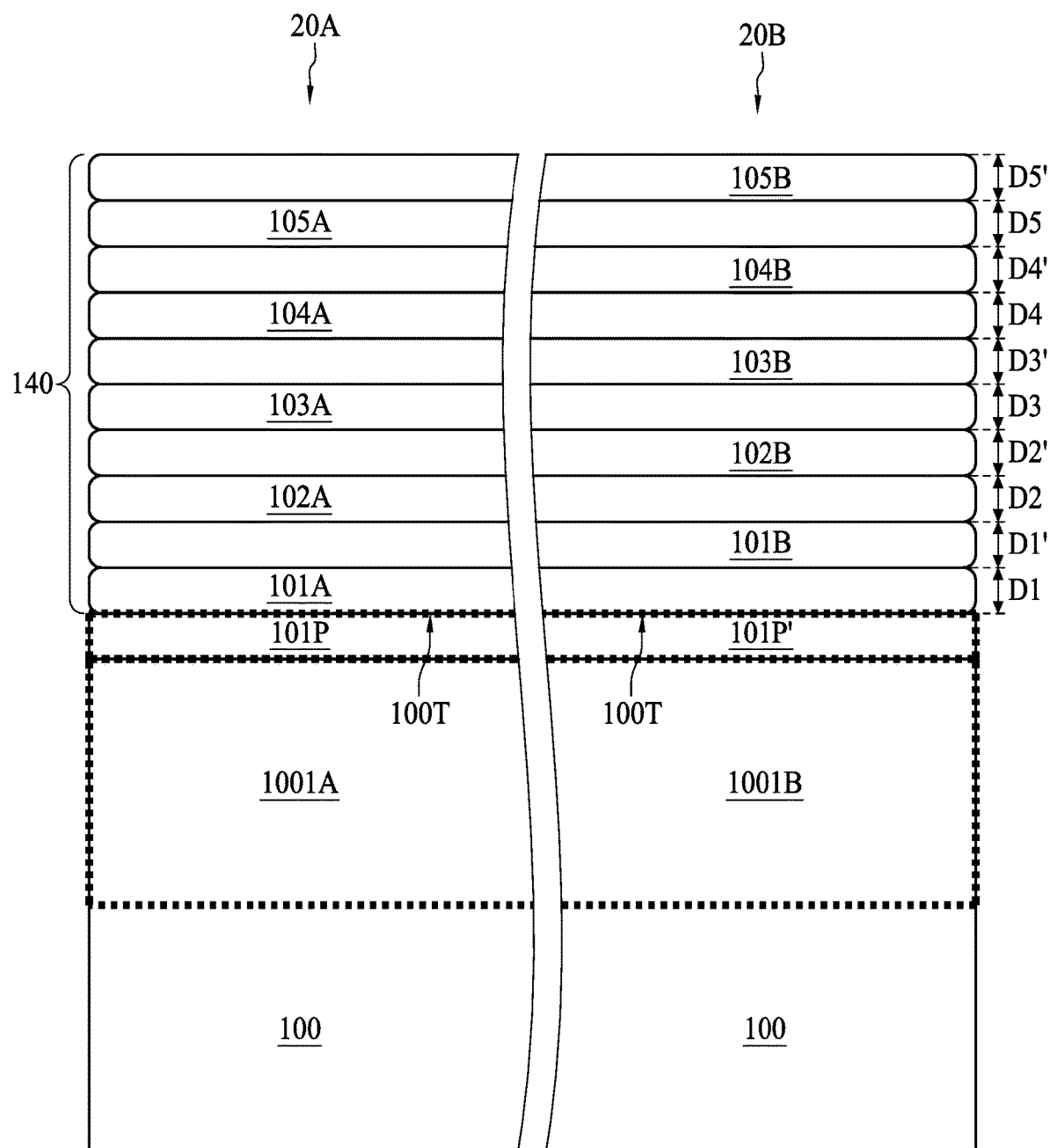
Figure 9:
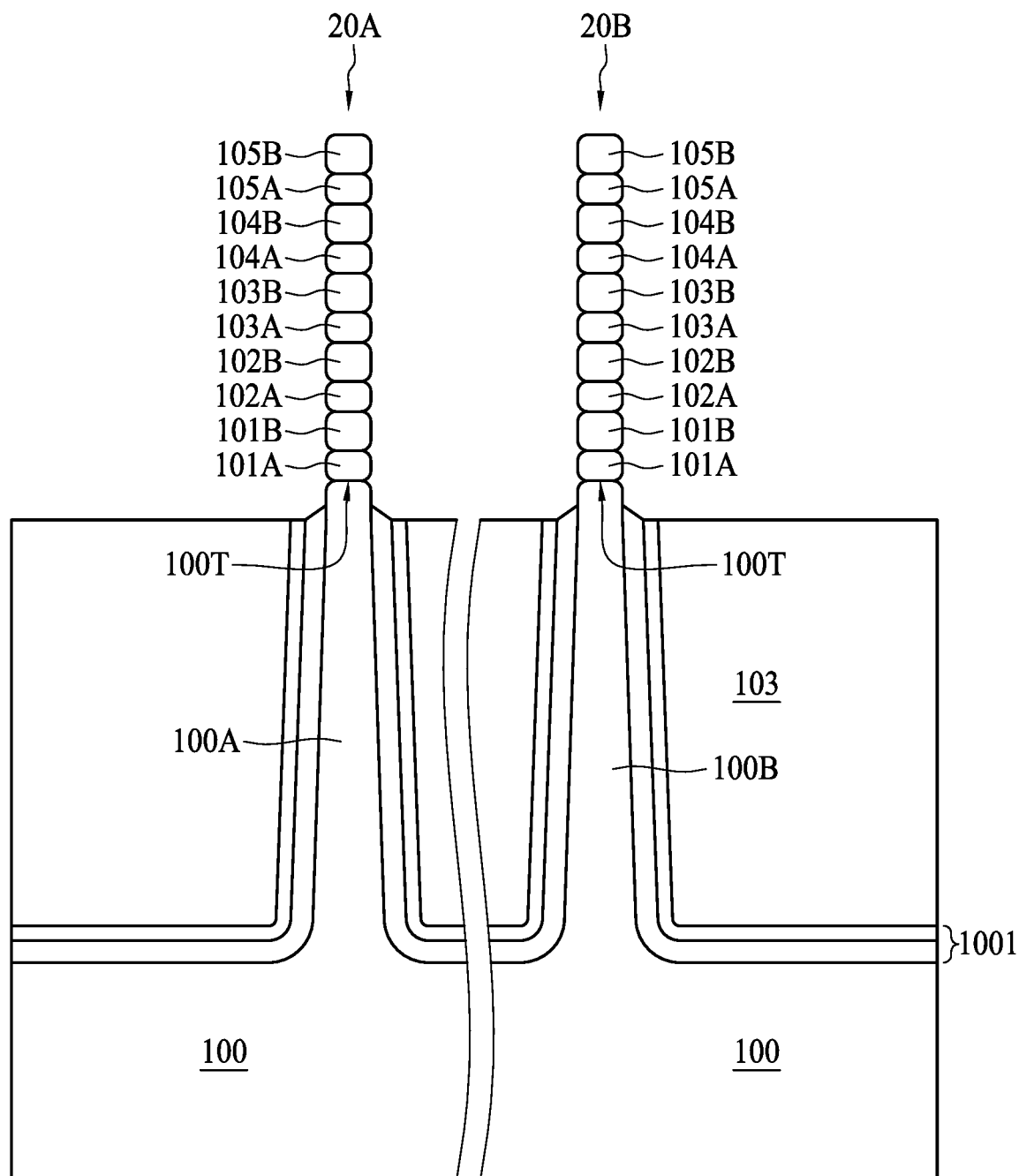

In FIG. 8, a first channel material and second channel material stack is formed over the top surface 100T. For example, a silicon and silicon germanium stack 140 is formed over the barrier layer 110A, 110B. For example, a first silicon and silicon germanium stack is formed over the substrate 100. The first silicon and silicon germanium stack includes one or more silicon layers and one or more silicon germanium layers. For example, the first silicon and silicon germanium stack includes a first silicon germanium layer 101A, a first silicon layer 101B, a second silicon germanium layer 102A, a second silicon layer 102B, a third silicon germanium layer 103A, a third silicon layer 103B, so on and so forth. It is appreciated that any number of silicon layers or silicon germanium layers can be formed. In an example, a silicon germanium layer comprises between about 20% to about 75% germanium. Alternatively, at least one of the aforesaid silicon germanium layer 101A, 102A, 103A, 104A, 105A can be replaced by a pure germanium layer. The silicon and silicon germanium stack 140 and the substrate 100 are then patterned to form semiconductor fins 100A and 100B, separated by an STI 103, as shown in FIG. 9. In some embodiments, at least one liner layer 1001 is formed after the patterning of the silicon and silicon germanium stack 140 and the substrate 100. For example, the at least one liner layer 1001 can be composed of nitride materials. Subsequently, the STI 103 is disposed to fill the trenches between the semiconductor fins 100A and 100B. Optionally, an etch back operation including fluorine gas is performed to render an appropriate height of the STI 103, for example, a height allowing the exposure of the silicon and silicon germanium stack fins derived from the silicon and silicon germanium stack 140 and covering the underlying bulk fin derived from the substrate 100. In some embodiments, a wet etch is performed to remove at least a portion of the liner 1001 previously deposited at the sidewall of the silicon and silicon germanium stack fins, such as for removal of nitride materials.

As shown in FIG. 8, the silicon and silicon germanium stack 140 is deposited in a way with various thicknesses. For example, a thickness D1 of the as-deposited silicon germanium layer 101A is different from a thickness D2 of the as-deposited silicon germanium layer 102A, a thickness D3 of the as-deposited silicon germanium layer 103A, a thickness D4 of the as-deposited silicon germanium layer 104A, and a thickness D5 of the as-deposited silicon germanium layer 105A. Particularly, thickness D1 is designed to be greater than any of D2, D3, D4, and D5. In some embodiments, thickness D1 is designed to be greater than D2, which is greater than D3, which is greater than D4, which is greater than D5.

In the naming convention provided above, thickness of an $N^{th}$ silicon germanium layer is denoted as DN. In some embodiments, when N equal to or greater than 6, DN is at least greater than D1 by 1.5 nm. In some embodiments, when N equal to or greater than 6, DN is at least greater than D1 by a range from about 1.5 nm to about 2.0 nm.

Similarly, a thickness D1' of the as-deposited silicon 101B is different from a thickness D2' of the as-deposited silicon layer 102B, a thickness D3' of the as-deposited silicon layer 103B, a thickness D4' of the as-deposited silicon layer 104B, and a thickness D5' of the as-deposited silicon layer 105B. Particularly, thickness D1' is designed to be greater than any of D2', D3', D4', and D5'. In some embodiments, thickness D1' is designed to be greater than D2', which is greater than D3', which is greater than D4', which is greater than D5'.

In the naming convention provided above, thickness of an $N^{th}$ silicon layer is denoted as DN'. In some embodiments, when N equal to or greater than 6. DN' is at least greater than D1' by 1.5 nm. In some embodiments, when N equal to or greater than 6, DN' is at least greater than D1' by a range from about 1.5 nm to about 2.0 nm.

Figure 10:
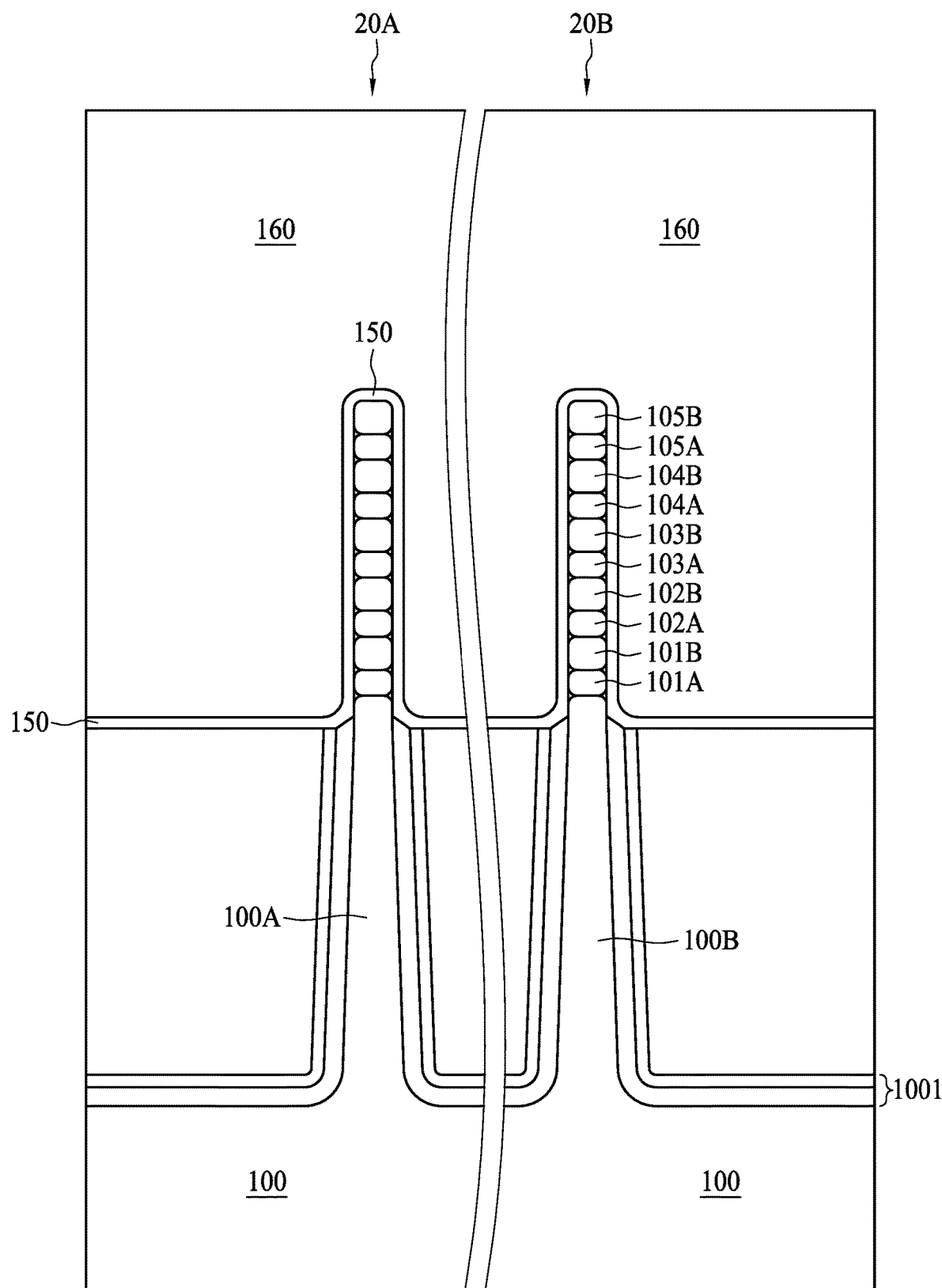

In FIG. 10, an input/output (I/O) oxide layer 150 is conformably formed over the portion of the fins 100A, 100B, the patterned silicon and silicon germanium stack 140, as well as the top surface of the STI 103. A dummy gate 160 is orthogonally formed, by a subsequent patterning operation, across the first and second fins 100A, 100B after the formation of the input/output (I/O) oxide layer 150. The dummy gate 160 is a sacrificial gate, such as a polygate, formed by a patterning technique for protecting gate or channel region from being affected by the source/drain 201A, 201B formation. In some embodiments, the source/drain 201A, 201B can be composed of SiGeB or SiP. The source/drain 201A, 201B may possess faceted boundaries as a result of limiting epitaxial growth rate in certain particular crystal directions.

In some embodiments, under the protection of the dummy gate 160, silicon and silicon germanium stack 140 at the source/drain region can be completely removed prior to the formation of the source/drain 201A, 201B in a recess created by the removal of the silicon and silicon germanium stack 140. In some embodiments, under the protection of the dummy gate 160, silicon and silicon germanium stack 140 at the source/drain region is neither released or removed prior to the formation of the source/drain 201A, 201B. In other words, the source/drain materials are deposited over the silicon and silicon germanium stack 140 at the source/drain region.

In some embodiments, under the protection of the dummy gate 160, dummy gate 160 is used as a hard mask for subsequent first nanowire releasing operation at the source/drain region (not shown in FIG. 10) prior to the source/drain 201A, 201B formation. When first releasing silicon germanium nanowire in a PMOS, silicon-based material would be removed by the appropriate etchant. On the other hand, when releasing silicon nanowire in the corresponding NMOS, silicon germanium-based material would be removed by the appropriate etchant. After the first nanowire releasing operation in the PMOS and the corresponding NMOS, a source/drain 201A, 201B is subsequently formed to be at both ends of the released nanowires (not shown in present disclosure). Alternatively stated, the released nanowires is in the source/drain 201A, 201B.

Figure 11:
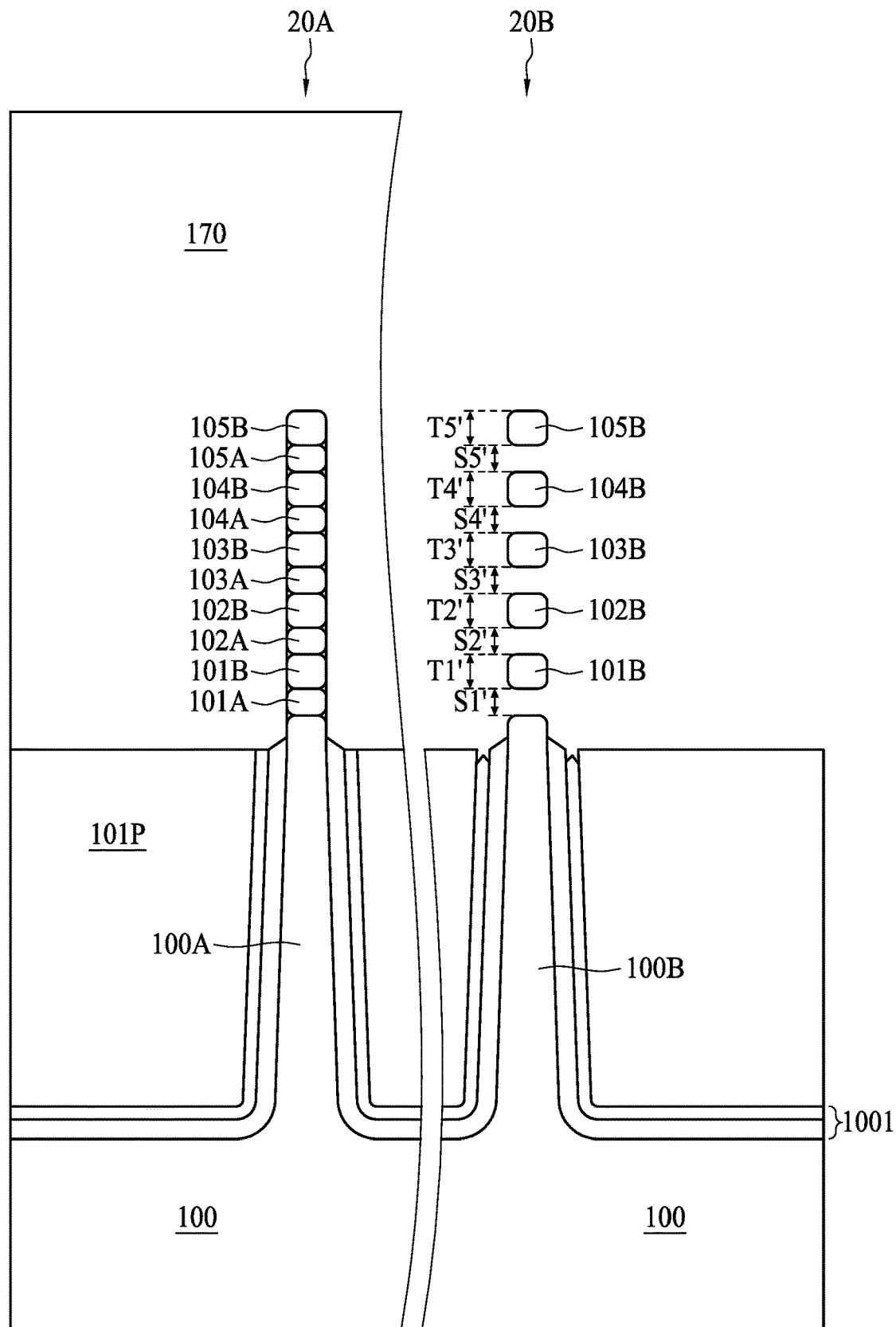

FIG. 11 and FIG. 12 show a second nanowire releasing operation at the channel region in PMOS 20A and NMOS 20B. Comparing to the first nanowire releasing operation, the second nanowire releasing operation is conducted at the channel region, which originally covered by the dummy gate 160, whereas the first nanowire releasing operation is conducted at the source/drain 201A, 201B, which was not covered by the dummy gate 160, and utilizing the dummy gate 160 as a hard mask. In FIG. 11, a hard mask 170 is disposed over the PMOS 20A and exposing the NMOS 20B to a silicon nanowire releasing operation. As previously discussed, proper etchant is utilized to release the Si nanowires 101B, 102B, 103B, 104B, 105B possesses lower selectivity on silicon-based material and greater selectivity on non-silicon-based material, for example, silicon germanium-based materials. As shown in FIG. 11, the released Si nanowires 101B, 102B, 103B, 104B, 105B each having a thickness of T1', T2', T3', T4', and T5', respectively. After silicon nanowire releasing, thicknesses T1', T2', T3', T4', and T5' of the Si nanowires are different from the thicknesses D1', D2', D3', D4', and D5' of the as-deposited silicon layers 101B, 12B, 103B, 104B, and 105B. For example, thickness T1' is greater than thickness D1'. In some embodiments, thicknesses D1', D2', D3', D4', and D5' of the silicon layers 101B, 12B, 103B, 104B, and 105B follows a relation of D1'>D2'>D3'>D4'>D5', whereas thicknesses T1', T2', T3', T4', and T5' of the released Si nanowires follows a relation of substantially equal to each other.

As shown in FIG. 11, the released Si nanowires 101B, 102B, 103B, 104B, 105B each having a spacing with its adjacent Si nanowires S1', S2', S3', S4', and S5', respectively. Due to the fact that the diffusion interface is thicker at the bottom than the top of the silicon and silicon germanium stack 140, the spacing S1' proximal to the bottom of the stack 140 appears to be greater than the spacing S5' distal to the bottom of the stack 140. In some embodiments, saplings S1', S2', S3', S4', and S5' follow a relation of S1'>S2'>S3'>S4'>S5'. In the naming convention provided above, spacing between an $N^{th}$ Si nanowire and an $(N+1)^{th}$ Si nanowire is denoted as S(N+1)'. In some embodiments, when N equal to or greater than 6, S(N+1)' is at least greater than S1' by 1 nm. In some embodiments, when N equal to or greater than 6, S(N+1)' is at least greater than S1' by a range from about 1 nm to about 1.5 nm.

Similarly, in FIG. 12, hard mask 180 is disposed over the NMOS 20B and exposing the PMOS 20A to a silicon germanium nanowire releasing operation. As previously discussed, the etchant utilized to release the SiGe nanowires 101A, 102A, 103A, 104A, 105A possesses lower selectivity on silicon germanium-based material and greater selectivity on non-silicon germanium-based material, for example, silicon-based materials. As shown in FIG. 12, the released SiGe nanowires 101A, 102A, 103A, 104A, 105A each having a thickness of T1, T2, T3, T4, and T5, respectively. After SiGe nanowire releasing, thicknesses T1, T2, T3, T4, and T5 of the SiGe nanowires are different from the thicknesses D1, D2, D3, D4, and D5 of the as-deposited silicon layers 101A, 102A, 103A, 104A, 105A. For example, thickness T1 is greater than thickness D1. In some embodiments, thicknesses D1, D2, D3, D4, and D5 of the silicon layers 101A, 102A, 103A, 104A, 105A follow a relation of D1>D2>D3>D4>D5, whereas thicknesses T1, T2, T3, T4, and T5 of the released SiGe nanowires follows a relation of substantially equal to each other.

As shown in FIG. 12, the released SiGe nanowires 101A, 102A, 103A, 104A, 105A each having a spacing with its adjacent SiGe nanowires S1, S2, S3, S4, and S5, respectively. Due to the fact that the diffusion interface is thicker at the bottom than the top of the silicon and silicon germanium stack 140, the spacing S1 proximal to the bottom of the stack 140 appears to be greater than the spacing S5 distal to the bottom of the stack 140. In some embodiments, saplings S1, S2, S3, S4, and S5 follow a relation of S1>S2>S3>S4>S5. In the naming convention provided above, spacing between an $N^{th}$ SiGe nanowire and an $(N+1)^{th}$ SiGe nanowire is denoted as S(N+1). In some embodiments, when N equal to or greater than 6, S(N+1) is at least greater than S1 by 1 nm. In some embodiments, when N equal to or greater than 6, S(N+1) is at least greater than Si by a range from about 1 nns to about 1.5 nm.

Figure 13:
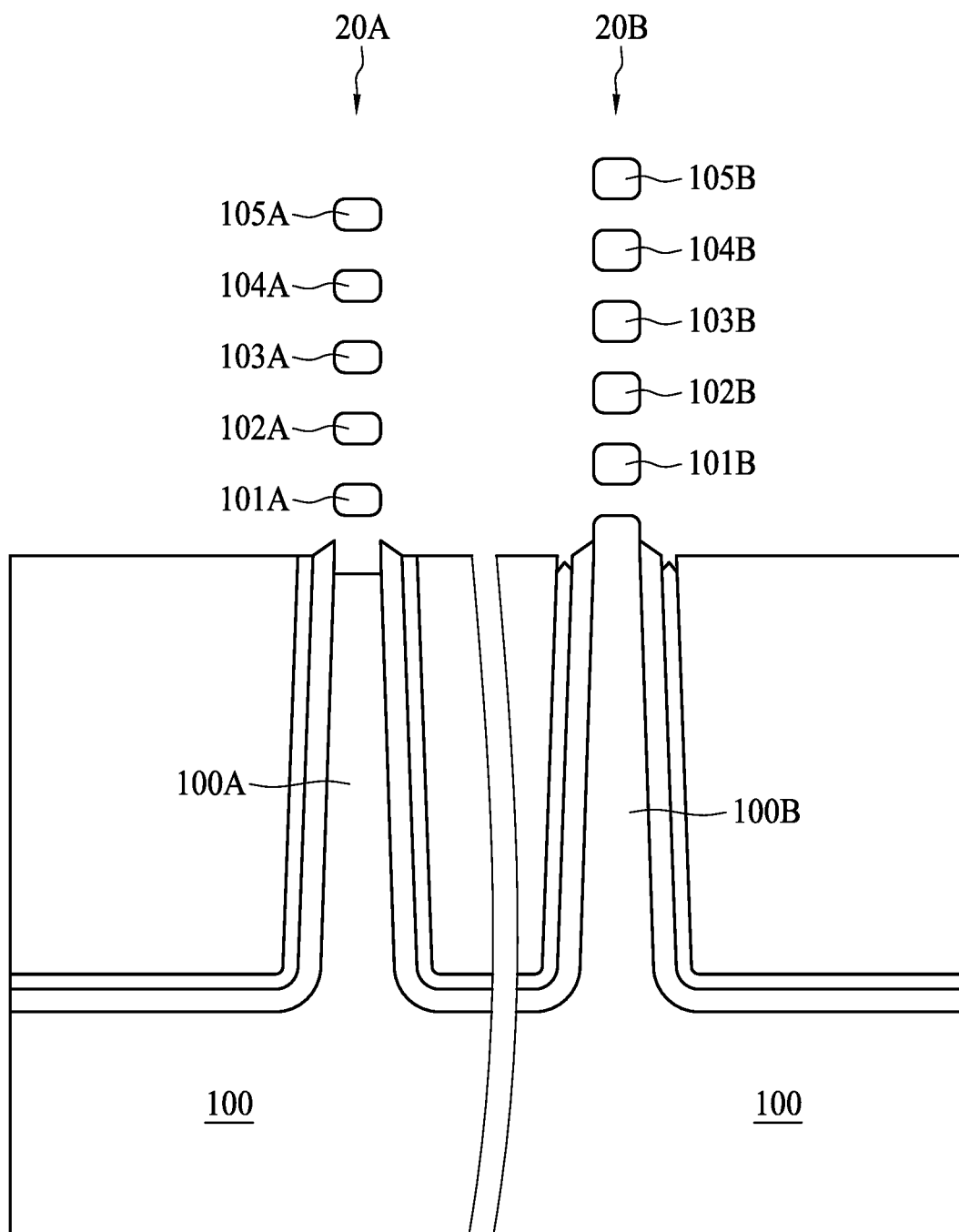
Figure 14:
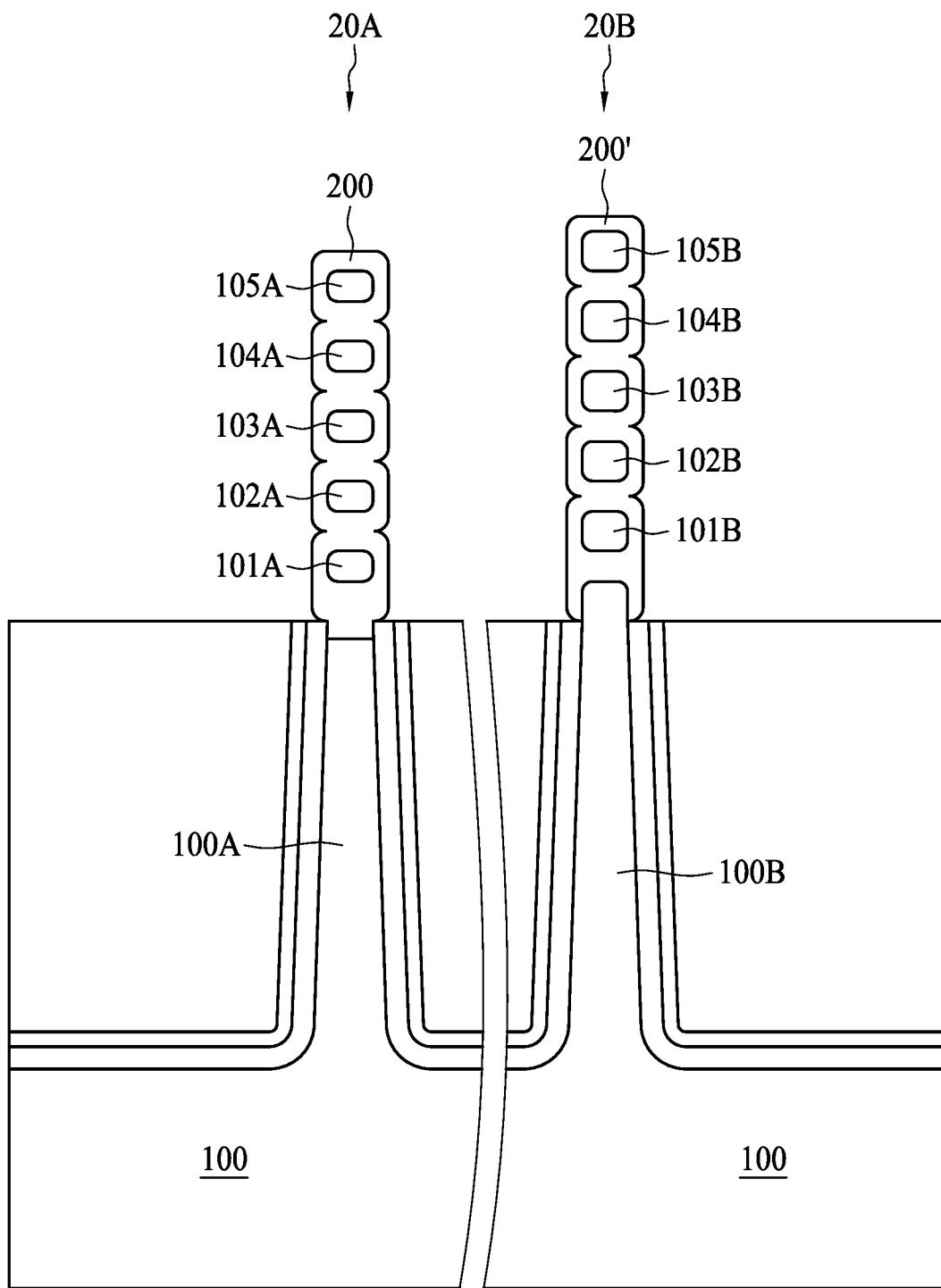

FIG. 13 shows a semiconductor structure 130 after removing the hard mask 180 in FIG. 12. Subsequently, gate materials 200, 200' (or replacement gate materials) are deposited to fill the space between adjacent released nanowires as well as the space between the top surface 100T and the bottom SiGe nanowire 101A or bottom Si nanowire 101B, as shown in FIG. 14. In some embodiments, gate material filling is performed at the PMOS 20A before the NMOS 20B. In other embodiments, gate material filling is performed at the NMOS 20B before the PMOS 20A. In some embodiments, replacement gate material including an interfacial layer material, a high-k dielectric layer, a titanium nitride capping/barrier layer, a work function metal layer, and tungsten gate metal can be formed around as well as over the plurality of released nanowires in the PMOS 20A and NMOS 20B.

In some embodiments, a method for forming a gate-all-around structure is provided. The method includes forming a plurality of a first type of semiconductor layers and a plurality of a second type of semiconductor layers alternately stacked over a fin. The first type of semiconductor layers comprises a first semiconductor layer and a second semiconductor layer, and the first semiconductor layer has a thickness greater than that of the second semiconductor layer. The method also includes removing the second type of semiconductor layers. In addition, the method includes forming a gate to wrap around the first type of semiconductor layers.

In some embodiments, a method for forming a gate-all-around structure is provided. The method includes forming a semiconductor stack over a semiconductor substrate. The semiconductor stack has a plurality of a first type of semiconductor layers and a plurality of a second type of semiconductor layers stacked alternately. The method also includes patterning the semiconductor stack to form a fin, in addition, the method includes forming a dummy gate stack across a portion of the fin. The method further includes removing the dummy gate stack and the second type of semiconductor layers to form a first nanowire, a second nanowire over the first nanowire and a third nanowire over the second nanowire. A first space between the first nanowire and the second nanowire is greater than a second space between the second nanowire and the third nanowire. The method also includes forming a gate wrapping around the first nanowire, the second nanowire and the third nanowire.

In some embodiments, a method for forming a gate-all-around structure is provided. The method includes forming first nanowire material stack and second nanowire material stack over a top surface of a substrate. The method also includes patterning the first nanowire material stack and second nanowire material stack and the substrate to form semiconductor fins separated from each other by an isolation. In addition, the method includes forming a dummy gate orthogonally over the semiconductor tins. The method further includes selectively removing the first nanowire material not covered by the dummy gate thereby exposing a second nanowire at a source/drain region. The method also includes removing the dummy gate. In addition, the method includes selectively removing the first nanowire material previously covered by the dummy gate thereby exposing the second nanowire at a channel region. The size of a first space between a first layer of the second nanowire over the top surface and a second layer of the second nanowire over the first layer of the second nanowire is different from a second space between the second layer of the second nanowire and a third layer of the second nanowire over the second layer of the second nanowire.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a gate-all-around structure, comprising:
    forming a plurality of a first type of semiconductor layers and a plurality of a second type of semiconductor layers alternately stacked over a fin, wherein the first type of semiconductor layers comprises a first semiconductor layer and a second semiconductor layer, and the first semiconductor layer has a thickness greater than that of the second semiconductor layer;
    removing the second type of semiconductor layers; and
    forming a gate to wrap around the first type of semiconductor layers.

2. The method of claim 1, wherein etching the first type of semiconductor layers during removing the second type of semiconductor layers.

3. The method of claim 2, wherein the first semiconductor layer has a thickness substantially equal to that of the second semiconductor after etching.

4. The method of claim 1, wherein removing the second type of semiconductor layers forms a first gap between the fin and the first semiconductor layer and a second gap between the first semiconductor layer and the second semiconductor layer, and the first gap is greater than the second gap.

5. The method of claim 4, wherein removing the second type of semiconductor layers forms a third gap between the second semiconductor layer and a third semiconductor layer over the second semiconductor layer, and the second gap is greater than the third gap.

6. The method of claim 1, wherein the first type of semiconductor layers comprises a third semiconductor layer over the second semiconductor layer, and the second semiconductor layer has a greater thickness than that of the third semiconductor layer.

7. The method of claim 6, wherein the second semiconductor layer has a thickness substantially equal to that of the third semiconductor after removing the second type of semiconductor layers.

8. The method of claim 1, wherein the first type of semiconductor layers include silicon germanium, and the second type of semiconductor layers include silicon.

9. A method for forming a gate-all-around structure, comprising:
    forming a semiconductor stack over a semiconductor substrate, wherein the semiconductor stack has a plurality of a first type of semiconductor layers and a plurality of a second type of semiconductor layers stacked alternately;
    patterning the semiconductor stack to form a fin;
    forming a dummy gate stack across a portion of the fin;
    removing the dummy gate stack and the second type of semiconductor layers to form a first nanowire, a second nanowire over the first nanowire and a third nanowire over the second nanowire, wherein a first space between the first nanowire and the second nanowire is greater than a second space between the second nanowire and the third nanowire; and
    forming a gate wrapping around the first nanowire, the second nanowire and the third nanowire.

10. The method of claim 9, wherein forming the dummy gate stack comprises:
    forming an oxide layer over the fin; and forming a dummy gate over the oxide layer.

11. The method of claim 9, wherein removing the dummy gate stack and the second type of semiconductor layers forms a fourth nanowire over the third nanowire, and a second space between the second nanowire and the third nanowire is greater than a third space between the third nanowire and the fourth nanowire.

12. The method of claim 9, further comprising: forming a source/drain to wrap around the first nanowire, the second nanowire and the third nanowire.

13. The method of claim 9, further comprising: forming a sacrificial layer on the semiconductor substrate before forming the semiconductor stack; implanting the semiconductor substrate to form a first well region abutting the sacrificial layer; and removing the sacrificial layer during removing the dummy gate stack and the second type of semiconductor layers.

14. The method of claim 13, further comprising: implanting the semiconductor substrate to form a second well region between the sacrificial layer and the first well region, wherein the second well region and the first well region have different type of dopants.

15. The method of claim 14, wherein a thickness of the second well region is less than a thickness of the first well region.

16. A method for forming a gate-all-around structure, comprising:
    forming first nanowire material stack and second nanowire material stack over a top surface of a substrate;

patterning the first nanowire material stack and second nanowire material stack and the substrate to form semiconductor fins separated from each other by an isolation;

forming a dummy gate orthogonally over the semiconductor fins;

selectively removing the first nanowire material not covered by the dummy gate thereby exposing a second nanowire at a source/drain region;

removing the dummy gate; and selectively removing the first nanowire material previously covered by the dummy gate thereby exposing the second nanowire at a channel region, wherein the size of a first space between a first layer of the second nanowire over the top surface and a second layer of the second nanowire over the first layer of the second nanowire is different from a second space between the second layer of the second nanowire and a third layer of the second nanowire over the second layer of the second nanowire.

17. The method of claim 16, wherein forming the first nanowire material and second nanowire material stack comprises:

forming a first layer of the first nanowire material over the top surface, the first layer of the first nanowire material having a first thickness;

forming the first layer of the second nanowire material over the first layer of the first nanowire material, the first layer of the second nanowire material having a second thickness; forming an $N^{th}$ layer of the first nanowire material over the first layer of the second nanowire material, N being an integer greater than 1, the $N^{th}$ layer of the first nanowire material having a third thickness; forming an $N^{th}$ layer of the second nanowire material over $N^{th}$ layer of the first nanowire material, the $N^{th}$ layer of the second nanowire material having a fourth thickness, forming an $(N+1)^{th}$ layer of the first nanowire material over the $N^{th}$ layer of the second nanowire material, the $(N+1)^{th}$ layer of the first nanowire material having a fifth thickness; and forming an $(N+1)^{th}$ layer of the second nanowire material over the $(N+1)^{th}$ layer of the first nanowire material, the $(N+1)^{th}$ layer of the second nanowire material having a sixth thickness, wherein the first thickness is greater than the third thickness, and the second thickness is greater than the fourth thickness.

18. The method of claim 16, wherein the first space is greater than the second space.

19. The method of claim 16, wherein the first space is at least greater than the second space by 1 nm.

20. The method of claim 16, further comprising forming a gate filling the first space and the second space at the channel region.

* * * * *